United States Patent
Chen et al.

(10) Patent No.: US 6,696,763 B2
(45) Date of Patent: Feb. 24, 2004

(54) SOLDER BALL ALLOCATION ON A CHIP AND METHOD OF THE SAME

(75) Inventors: Shu-Hui Chen, Taipei Hsien (TW); Hsiu-Tzu Chen, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 95 days.

(21) Appl. No.: 09/990,920

(22) Filed: Nov. 13, 2001

(65) Prior Publication Data

US 2002/0142574 A1 Oct. 3, 2002

(30) Foreign Application Priority Data

Apr. 2, 2001 (TW) .......................................... 90107846 A

(51) Int. Cl.[7] .......................... H01L 23/48; H01L 23/52; H01L 29/40
(52) U.S. Cl. ...................... 257/778; 257/780; 257/772; 257/779; 257/750; 257/737
(58) Field of Search ................................. 257/778, 780, 257/772, 779, 750, 758, 737, 748

(56) References Cited

U.S. PATENT DOCUMENTS

| | | | | |
|---|---|---|---|---|
| 4,420,203 A | * | 12/1983 | Aug et al. ................... | 439/71 |
| 5,770,889 A | * | 6/1998 | Rostoker et al. ............ | 257/698 |
| 5,877,553 A | * | 3/1999 | Nakayama et al. ......... | 257/708 |
| 6,444,563 B1 | * | 9/2002 | Potter et al. ................ | 438/615 |
| 6,452,262 B1 | * | 9/2002 | Juneja ......................... | 257/691 |
| 6,498,055 B2 | * | 12/2002 | Fukuda et al. .............. | 438/127 |
| 6,512,680 B2 | * | 1/2003 | Harada et al. .............. | 361/777 |
| 6,562,661 B2 | * | 5/2003 | Grigg .......................... | 438/125 |

* cited by examiner

*Primary Examiner*—Matthew Smith
*Assistant Examiner*—Chuong A Luu
(74) *Attorney, Agent, or Firm*—J.C. Patents

(57) ABSTRACT

A solder ball allocation on a chip, and a method of the same are provided. The chip has a substrate, first solder balls and second solder balls. The first solder balls are located on a periphery of the substrate and arranged outwardly. The second solder balls are located in a central part of the substrate and arranged with several first geometric patterns that construct a second geometric pattern. The first geometric patterns are also arranged to divide the chip into several power source blocks. The conflict between the second solder balls and the power source blocks are analyzed to remove the second solder balls with conflicts. The power line can go through the middle directly to avoid the power source bypass, or other reasons that cause the chip unable to work stable. The invention divides the chip into several power source blocks without increase the chip volume and cost.

16 Claims, 3 Drawing Sheets

SOLDER BALL ALLOCATION ON A CHIP AND METHOD OF THE SAME

CROSS-REFERENCE TO RELATED APPLICATION

This application claims the priority benefit of Taiwan application serial no. 90107846, filed on Apr. 2, 2001.

BACKGROUND OF THE INVENTION

1. Field of the Invention

The invention relates in general to an integrated circuit, and more particularly, to a solder ball allocation and a method for allocating the solder balls.

2. Description of the Related Art

A normal personal computer system is basically an assembly of a motherboard, an interface card and a peripheral; the motherboard is the base of the computer system. The motherboard comprises a central processing unit (CPU), several memory module slots, slots for installing the interface cards and a control chip set.

As semiconductor technique becomes increasingly advanced, chip operation is more powerful, and the integral functions thereof are also multiplied. The grid array package (GA) is one of the commonly used packages.

In early computers, the integral functions of the chip were small and slow, so that fewer voltage sources were required. The division of the power source block on the chip was easily formed without affecting the stability of the chip. In the current technique, as many functions and circuits, previously controlled and managed externally, have been integrated into one chip, the variety of the power source is increased. That is, the chip requires various voltage sources and more power source blocks to provide various voltages. As the chip is designed with increasing delicacy, residual space is reduced. The circuit layout cannot reach each region.

FIG. 2 shows a conventional through hole location. The power source blocks VCC3 50, 72 belong to the same voltage source and are connected with each other. Due to the existence of the through holes 54 and 56 in between, a fine wire is used to go through the through holes 54 and 56, or connected externally the power source blocks VCC3 50 and 72. The very fine wire is a poor conductor and is easily broken to cause chip damage. If the external wiring is adopted, the wiring distances for the power source blocks VCC3 50 and 72 are different to cause a voltage difference that affects the stability of the chip.

SUMMARY OF THE INVENTION

As a small volume and powerful functions become the leading trends of the industry, a solder ball allocation and a method thereof have to be developed to obtain a better performance and a more stable operation for the chip in the same environment. The Chinese patent application number 90100703 that increases the area of the ground plane is incorporated as a reference of the invention.

The invention provides a solder ball allocation and a method thereof Without increasing the chip area, the chip volume and the cost, the chip can be divided into various power source blocks.

For the solder ball allocation, the chip comprises a substrate, several first solder balls and second solder balls. The first solder balls are located in the periphery of the substrate. The first solder balls are spaced from each other by a first distance and arranged outwardly. The second solder balls are used to connect external devices. The second solder balls are located in a central part of the substrate and spaced from each other by a second distance. The second solder balls are arranged with several first geometric patterns that further construct a second geometric pattern with the center of the substrate as a center thereof. The distance from the center of the substrate to the corresponding point of the first geometric patterns is the same. The first solder region is spaced from the second solder region by a third distance, which is larger than the first and the second distance.

The above chip includes a ball grid array (BGA) packaged chip. The first and second solder balls are used for signal and ground connection. There are thirty two second solder balls. The second solder balls help the heat dissipation of the chip. The first geometric patterns and the second geometric pattern include rectangular patterns.

The invention provides a method of solder ball allocation on a chip. The chip comprises a substrate and several second solder balls for external connection. The second solder balls are located at a central part of the substrate, and the second solder balls are equidistant from each other and arranged outwardly. The chip is divided into various power source blocks. The conflicts between the second solder balls and the power source blocks are analyzed. The second solder balls having conflicts with the power source blocks are removed. The removed solder balls can be shifted to other locations on the chip.

The invention further provides a solder ball allocation on a chip. The chip comprises a substrate, several first solder balls for external connection and several second solder balls for external connection. The first solder balls are located in the periphery of the substrate. Each of the first solder balls is spaced from a neighboring first solder ball thereof by a first distance. The first solder balls are arranged outwardly. The second solder balls are located on a central part of the substrate and are equidistant from each other by a second distance. The second solder balls are arranged as a hollow geometric pattern with a center of the substrate as the center thereof The first solder balls and the second solder balls are spaced by a third distance. The third distance is larger than the first and the second distances.

The above chip includes a ball grid array packaged chip. The first and second solder balls are used for signal and ground connections. There are thirty two second solder balls. The second solder balls help the heat dissipation of the chip. The hollow geometric pattern includes a hollow rectangular pattern.

Both the foregoing general description and the following detailed description are exemplary and explanatory only and are not restrictive of the invention, as claimed.

DESCRIPTION OF THE PREFERRED EMBODIMENTS

Figure 1:
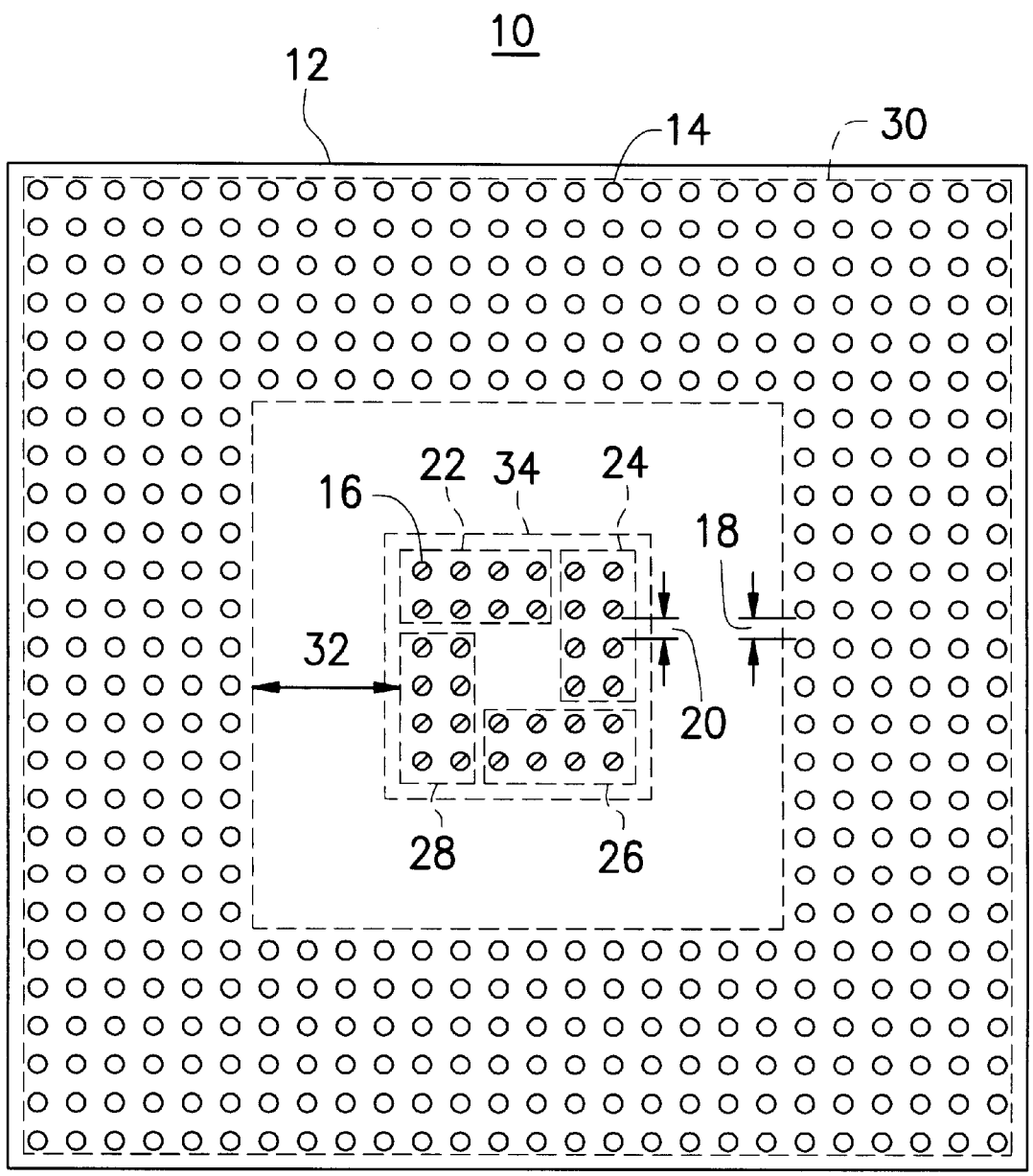
FIG. 1 shows solder ball allocation on a chip according to one embodiment of the invention.

In FIG. 1, a ball grid array package is used as an example to illustrate the solder ball allocation on a chip according to the invention. The chip 10 comprises a substrate 12, a plurality of first solder balls 14 and a plurality of second solder balls 16. The first solder balls 14 used for external connection are located in a periphery 30 of the substrate 12. Each of the first solder balls 14 is spaced from a neighbouring first solder ball 14 by a first distance 18, and is arranged outwardly. The second solder balls 16 used for external connection are located at a central part of the substrate 12. The second solder balls 16 are equidistant from each other by a second distance 20. The second solder balls 16 are arranged with several first geometric patterns 22, 24, 26 and 28 that further form a second geometric pattern 34 with a center of the substrate 12 as the center thereof. The center of the substrate 12 has a same distance to any corresponding point of the first solder balls 14. The first solder balls 14 are spaced from the second solder balls 16 by a minimum distance, hereinafter referred to as the third distance 32. The third distance 32 is larger than the first distance 18 and the second distance 20.

The chip includes a ball grid array packaged chip. The first and second solder balls 14 and 16 are used for signal and ground connections. There are 32 second solder balls 16. The second solder balls 16 help heat dissipation of the chip 10. In this embodiment, the first geometric patterns 22, 24, 26 and 28 and the second geometric pattern 34 include rectangular patterns. It is appreciated that the first and second geometric patterns 22, 24, 26, 28 and 34 are not limited to rectangular patterns, and that other pattern shapes can also be applied in the invention according to specific requirements.

Figure 2:
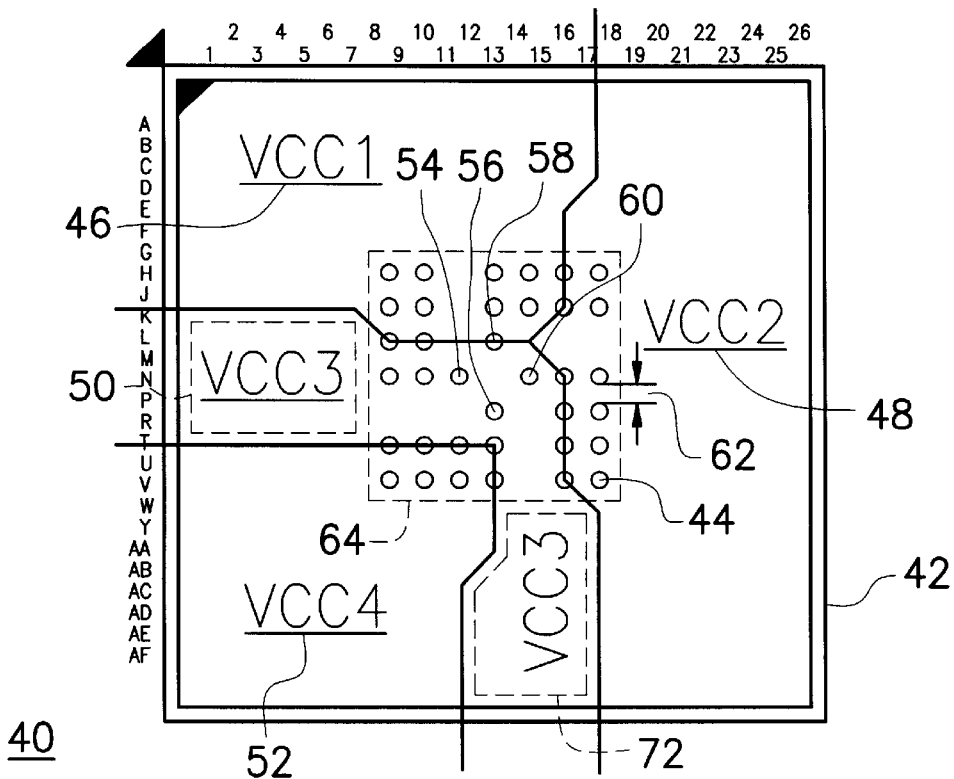
FIG. 2 shows the conventional allocation of through holes on a chip.
Figure 3:
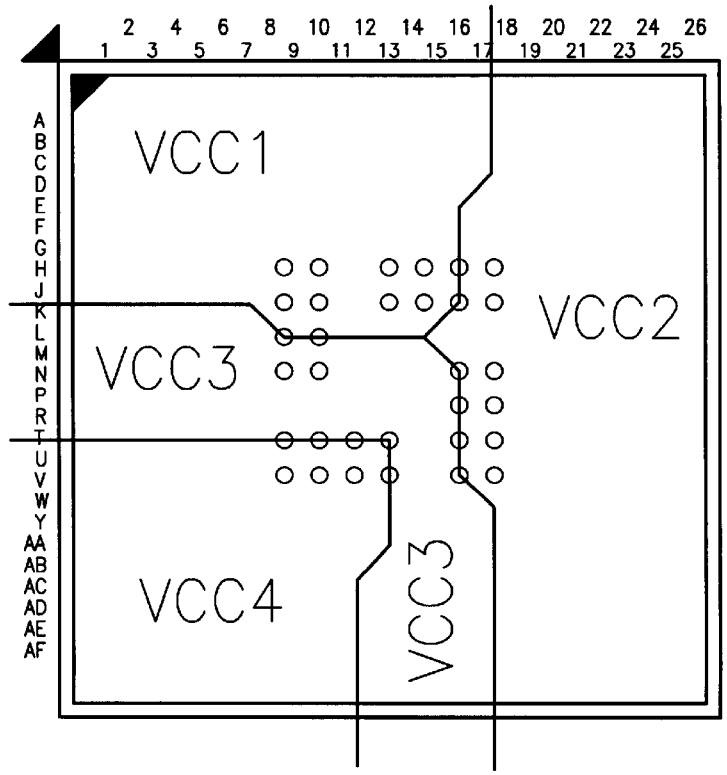
FIG. 3 shows allocation of through holes on a chip according one embodiment of the invention.

Referring to FIG. 2 and FIG. 3, the allocation of through holes in the prior art and in the invention are respectively shown. The chip comprises a substrate 42, a plurality of second solder balls and a plurality of through holes 44. The second solder balls are located in a central part 64 of the substrate 42 used for external connection. Each of the second solder balls is arranged outwardly and connected to the other second solder ball via one through hole 44. The through holes 44 are also located at the central part 64 of the substrate 42 and equidistant from each other. The chip 40 is divided into several power source blocks 46, 48, 50, 52 and 72. How to convert from the prior art as shown in FIG. 2 to the invention as shown in FIG. 3 is described as follows.

The required power source blocks 46, 48, 50, 52 and 72 are divided on the chip 40. Whether the though holes 44 and the power source blocks 46, 48, 50, 52 and 72 are blocked and do not connect due to the blockage of the through holes 44 is analyzed. The solder balls 54, 56, 58 and 60 that cause the power source blocks blocked are removed as shown in FIG. 3.

The removed solder balls 54, 56, 58 and 60 can be shifted to other positions of the substrate 42. Therefore, the chip 40 has a large ground area and an improved heat dissipation environment to prevent the chip 40 from being abnormal due to insufficient ground that causes unstable voltage or overheating of the chip 40.

In FIG. 3, an embodiment of through hole allocation of the invention is shown. In the invention, after removing the through holes that affect the connection of the power source blocks, the power line can be connected to any power source block without being blocked by any solder balls and through holes. The chip can thus be operated under a stable voltage environment. The performance of the chip is thus improved significantly.

Figure 4:
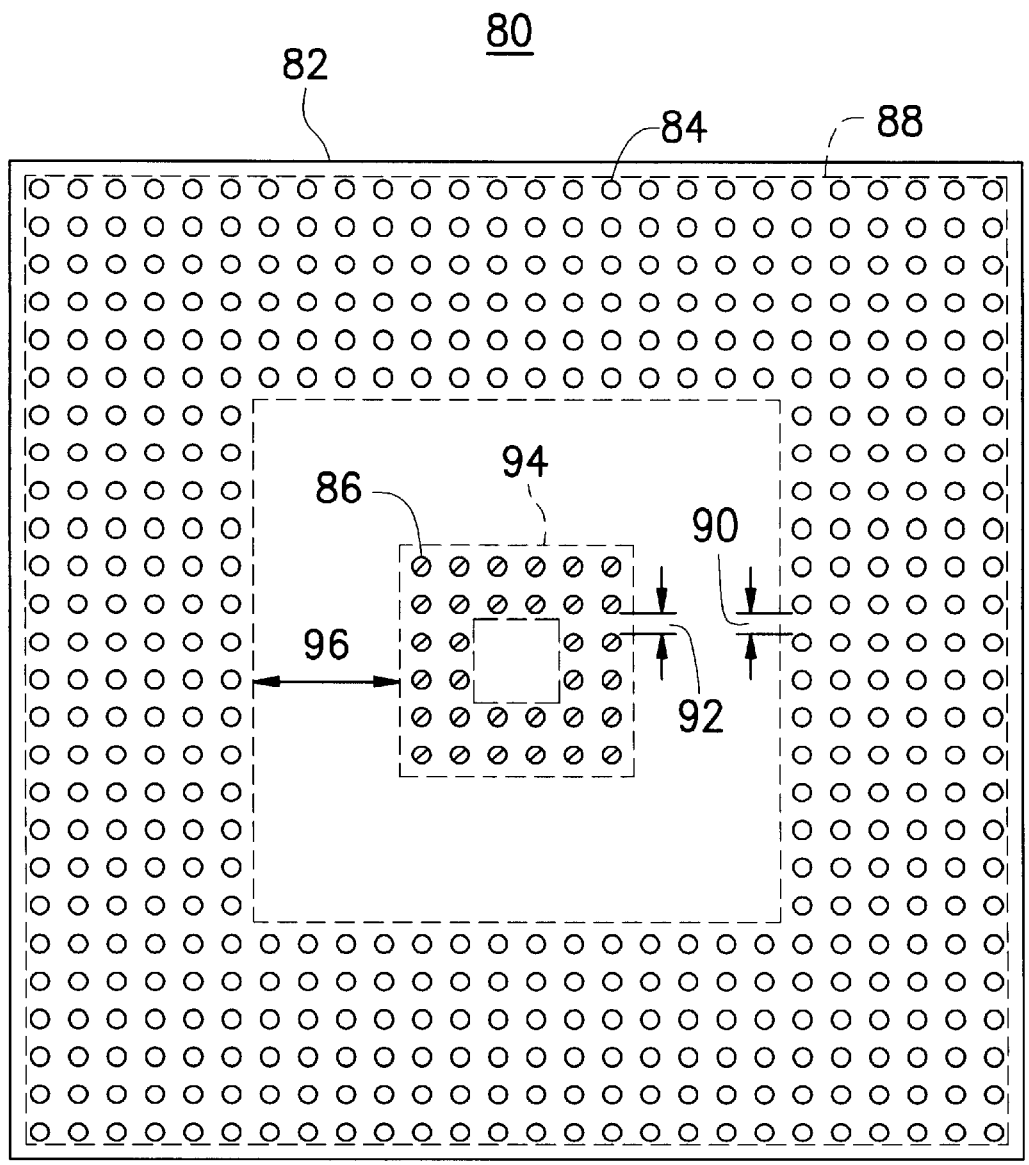
FIG. 4 shows solder ball allocation on a chip according to the invention.

FIG. 4 shows an embodiment of solder ball allocation on a chip according to the invention. The chip 80 comprises a substrate 82, first solder balls 84 and second solder balls 86. The first and second solder balls 84 and 86 are used for external connection. The first solder balls 84 arranged outwardly are located in a periphery 88 of the substrate 82 with a first distance 90 spaced from each other. The second solder balls 86 are located in a central part of the substrate 82 and separated from each other by a second distance 92. The second solder balls 86 are arranged with a hollow geometric pattern 94 with a center of the substrate 82 as the center thereof The first solder balls 84 and the second solder balls 86 are separated from each other by a minimum distance, hereinafter a third distance 96. The third distance 96 is larger than the first distance 92 and the second distance 94.

The chip 80 includes a ball grid array packaged chip. The first solder balls 84 and the second solder balls 86 are used for signal and ground connections. For example, to carry enough current, there are at least thirty two second solder balls 86. The second solder balls 86 improve the heat dissipation of the chip. In the embodiment, the hollow geometric pattern includes a rectangular pattern; however, it is not restricted thereby.

According to the solder ball allocation on a chip and the method thereof of the invention, the chip can be divided into several power source blocks. Without increasing the volume and additional cost, the division of the power source blocks is complete, and the operation stability of the chip is improved. In addition, the heat dissipation effect is enhanced to improve the yield of products.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A solder ball allocation on a chip, the chip comprising:
   a substrate;
   a plurality of first solder balls, used for external connection and arranged outwardly, wherein said first solder balls are located in a periphery of said substrate and are separated from each other by a first distance; and
   a plurality of second solder balls, used for external connection and located in a central part of said substrate, wherein said second solder balls are arranged with a plurality of first geometric patterns that construct a second geometric pattern with a center of said substrate as a center thereof, said second solder balls are separated from each other by a second distance, and said second solder balls and said first solder balls are separated from each other by a third distance, wherein said third distance is larger than said first and said second distances; and
   a plurality of through holes, located in said central part of said substrate; and
   a plurality of power source blocks arranged in said central part of said substrate such that a power line can be connected to any of said power source blocks without being blocked by any of said second solder balls and said through holes.

2. The solder ball allocation according to claim 1, wherein said chip includes a ball grid array packaged chip.

3. The solder ball allocation according to claim 1, wherein said first solder balls are used for signal connection.

4. The solder ball allocation according to claim 1, wherein said second solder balls are used for ground connection.

5. The solder ball allocation according to claim 1, including thirty two second solder balls.

6. The solder ball allocation according to claim 1, wherein said first geometric patterns include a plurality of rectangular patterns.

7. The solder ball allocation according to claim 1, wherein said second geometric pattern includes a rectangular pattern.

8. A solder ball allocation on a chip, the chip comprising:
   a substrate;
   a plurality of first solder balls used for external connection, said first solder balls being arranged outwardly in a periphery of said substrate, wherein said neighboring first solder balls are separated from each other by a first distance; and
   a plurality of second solder balls, used for external connection and located in a central part of said substrate, wherein neighboring second solder balls are spaced from each other by a second distance, and said second solder balls form a hollow geometric pattern with a center of said substrate as said center, and said second solder balls are spaced from said first solder balls by a third distance that is larger than said first and said second distances; and
   a plurality of through holes, located in said central part of said substrate; and
   a plurality of power source blocks arranged in said central part of said substrate such that a power line can be connected to any of said power source blocks without being blocked by any of said second solder balls and said through holes.

9. The solder ball allocation according to claim 8, wherein said chip comprises a ball grid array packaged chip.

10. The solder ball allocation according to claim 8, wherein said first solder balls are used for signal connection.

11. The solder ball allocation according to claim 8, wherein said second solder balls are used for ground connection.

12. The solder ball allocation according to claim 8, including thirty two second solder balls.

13. The solder ball allocation according to claim 8, wherein said hollow geometric pattern includes a hollow rectangular pattern.

14. A solder ball allocation on a chip, the chip comprising:
   a substrate;
   a plurality of through holes, located in said central part of said substrate; and
   a plurality of solder balls, located in said central part of said substrate, wherein each of said solder balls are arranged outwardly and connected to the other solder ball via one of said through hole;
   a plurality of power source blocks arranged in said central part of said substrate such that a power line can be connected to any of said power source blocks without being blocked by any of said solder balls and said through holes.

15. The solder ball allocation according to claim 14, wherein said chip is a ball grid array packaged chip.

16. The solder ball allocation according to claim 14, wherein said solder balls are used for ground connection.

* * * * *